United States Patent [19]

Matsue et al.

[11] 3,962,686

[45] June 8, 1976

[54] MEMORY CIRCUIT

[75] Inventors: Shigeki Matsue; Hajime Shirato, both of Tokyo, Japan

[73] Assignee: Nippon Electric Company Limited, Tokyo, Japan

[22] Filed: Aug. 9, 1974

[21] Appl. No.: 496,190

Related U.S. Application Data

[63] Continuation of Ser. No. 360,687, May 16, 1973, abandoned.

[30] Foreign Application Priority Data

May 16, 1972 Japan................................ 47-48876

[52] U.S. Cl............................. 340/173 R; 340/172.5
[51] Int. Cl.².......................................... G11C 13/00
[58] Field of Search................................ 340/173 R

[56] References Cited

UNITED STATES PATENTS 3,763,480  10/1973  Weimer........................... 340/173 R
3,772,658  11/1973  Sarlo.............................. 340/173 R

*Primary Examiner*—Terrell W. Fears
*Attorney, Agent, or Firm*—Hopgood, Calimafde, Kalil, Blaustein & Lieberman

[57] ABSTRACT

A memory circuit employing insulated-gate field-effect transistors includes a first circuit for generating a signal upon the completion of one of the circuit functions involved in the operation of the memory circuit. That signal is applied to a second circuit which thereupon produces a timing signal that is used to control a second circuit function of the memory circuit.

17 Claims, 18 Drawing Figures

MEMORY CIRCUIT

This is a continuation of application Ser. No. 360,687, filed May 16, 1973, now abandoned.

The present invention relates generally to memory circuits employing insulated-gate field-effect transistors (hereinafter referred to as IGFET), and more particularly to a control circuit in the memory circuit of this kind.

Transistor circuits employing IGFET's may be divided into two types, that is, a dynamic type and a static type. The dynamic type circuit is superior to the static type in various respects such as high speed of operation, lower power consumption, and a possible reduction in size of IGFET's. Therefore, the dynamic type circuit is very effective when applied to a large scale monolithic memory circuit in which a number of circuit functions are involved, high speed of operation and low power consumption are required, and where the IGFET's need be made as small as possible to confine a semiconductor memory chip to a small size. The operation of the dynamic type IGFET circuit, however, requires timing signals. The memory device including dynamic type IGFET circuits necessitates timing signals which command the operations of various circuit functions in sequence. With the conventional monolithic memory devices, the timing signals are generated external of the memory device by the use of, for example, delay lines and logic circuits, and are supplied from the external location to the memory devices. Although it is convenient in the operation of the memory circuit to increase the number of timing signals, any increase in the number of timing signals to be supplied from an external source produces difficulties in the generation and drive of the complex timing signals.

It is an object of the present invention to provide an IGFET memory circuit including a dynamic type circuit in which internal timing signals are efficiently generated by the use of a timing signal applied from an external source, thereby preventing an increase in the number of externally applied timing signals.

It is another object of the present invention to provide control circuits coupled with an IGFET memory circuit, which automatically generate internal timing signals.

According to the present invention, an IGFET memory circuit comprises a first circuit generating a signal in response to the completion of the operation of one of the circuit functions included in the memory circuit, and a second circuit receiving the signal of the first circuit and generating a timing signal to command the commencement of the operation of a subsequent circuit function. The first and second circuits are connected in series and where a plurality of internal timing signals are needed, a plurality of pairs of such first and second circuits are provided in the memory circuit.

Where the memory circuit includes decoder circuits for operating a function of decoding input address signals and more particularly, where each of such decoder circuits consists of an OR circuit (or a NOR circuit), the circuit for generating a signal in response to the completion of the operation of the decoder circuits or the decoding function is formed of an OR circuit (or a NOR circuit) receiving both the true and the complementary signals of the one same address signal as input signals. A signal indicating the completion of a "read" operation of the stored information from the selected memory cells is generated by a circuit including such a memory cell connected to an address line (i.e. word line) of a matrix of the memory cells that is adapted to draw a current from or drain a current to the external whenever the connected address line is selected. Such additional memory cell may be the same as or different from the cell of the memory matrix.

Where the memory matrix of the memory circuit contains pairs of digit lines (i.e. bit lines) and an information read out from a memory cell to one of each paired digit lines (hereinafter referred to as a "read" digit line) is transmitted to the other of each paired digit lines (also referred to as a "write" digit line), the present invention provides a circuit generating a signal which indicates the completion of the information transmission from the "read" digit line to the "write" digit line. Such circuit comprises an input terminal adapted to receive a timing signal commanding the aforementioned information transmission, a "write" digit line, and means for changing the level of this "write" digit line whenever the aforementioned timing signal is applied to the input terminal. In this circuit, the "write" digit line may be connected to the additional memory cell described above.

A monolithic memory circuit may include address buffer circuits which receive input address signals, amplify them, invert them, and thus produce the amplified true and complementary signals of each address signal. A signal indicating the completion of such operation of the address buffer circuits can be produced by a circuit which receives the true and complementary signals of one address signal, that is, the output signals of one address buffer circuit, detects the difference in the potential levels of the two signals, and generates a signal when the difference detected exceeds a predetermined value.

Now the present invention will be described more in detail with respects to embodiments thereof by referring to the attached drawings, in which.

The description of the invention in this specification is specifically directed to the use of N-channel type IGFET's in which a high level represents the level "1" (binary one), and a low level represents the level "0" (binary zero). The functions of the circuits, however, are essentially identical where P-channel type IGFET's are employed and the invention is equally applicable to circuits employing P-channel IGFET's. The present invention can thus be generally applied to memory circuits employing any kinds of IGFET's. Moreover, although a memory circuit of 1024 bits is specifically described below as an example of the invention, the present invention can be applied with equal benefits to memory circuits of any number of bits.

Figure 1:
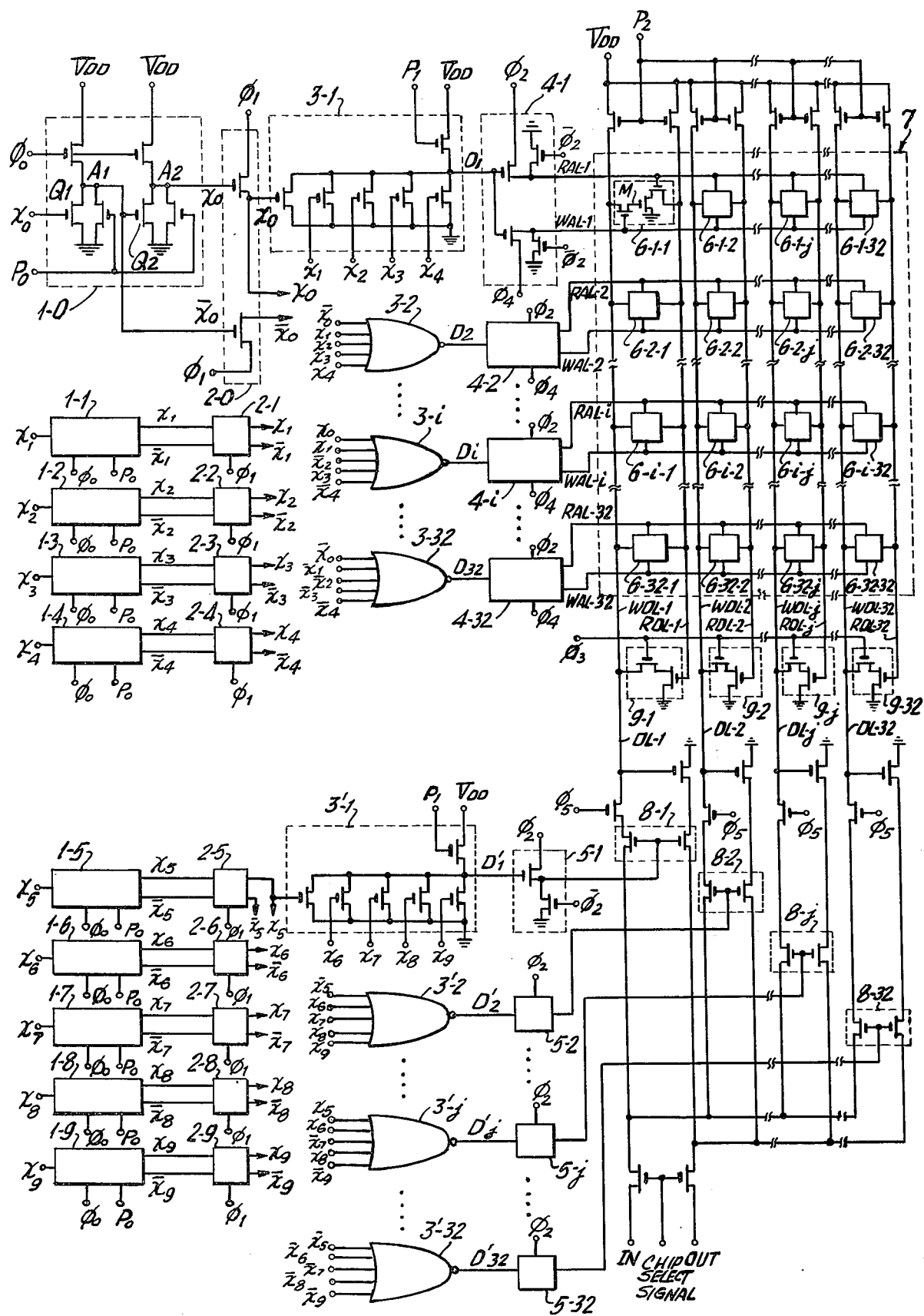
FIG. 1 is a schematic diagram, partially shown in a block diagram, of a memory circuit employing 3-transistor memory cells, to which an embodiment of the invention may be applied.

Referring to FIG. 1, there is shown a memory circuit of 1024 bits which receives ten address signals $X_0$ to $X_9$ supplied from an external signal source. It is necessary to produce an inverted signal of each address signal in the memory circuit and the IGFET memory devices are preferably TTL-compatible. To meet these requirements, not only the inverted signals but also the signals in phase with the input address signals need be amplified in the memory circuit. The circuit of FIG. 1 is provided with address buffers 1 which invert and amplify the address signals. Each input address signal $X_0$, $X_1$, ... $X_9$ is applied to each address buffer 1-0, 1-1, ... 1-9 which produces the amplified true and complementary signals $(X_0, \overline{X}_0)$, $(X_1, \overline{X}_1)$, ... $(X_9, \overline{X}_9)$ of each address signal. These signals are applied, through respective switches 2-0, 2-1, ... 2-9, to decoders 3, 3' which consist of 5-input NOR circuits. Outputs D of the decoders 3 are used for the selection of 1024 memory cells 6 which are arranged to form a matrix 7 of 32 lines by 32 columns. The selection of 1024 bits is divided into two parts. The selection of 32 words in the memory matrix 7 is performed by using the true and complementary signals of five address signals $X_0$ to $X_4$ which are applied to 32 address decoders 3-1 to 3-32. The output Di of the selected decoder 3-i is subjected to power amplification for increasing the operation speed by another switch 4-i and applied to the selected pair of "read" and "write" address lines RAL-i and WAL-i. As a result, memory cells 6-i-1 to 6-i-32 of 32 bits connected to the selected address line pair are simultaneously subjected to either "read" of the stored information to "read" digit lines RDL-1 to RDL-32 or "write" of information from "write" digit lines WDL-1 to WDL-32.

The selection of 32 bits in the memory matrix 7 is carried out by using the remaining five address signals $X_5$ to $X_9$, and the true and complementary signals of which are also supplied to 32 digit decoders 3'-1 to 3'-32. The output $D'_j$ of only one decoder 3'-j selected is amplified by a switch 5-j and applied to a switch 8-j to connect the selected digit line DL-j of the memory matrix to the data input and output terminals IN and OUT. As a result, information stored in only one memory location is selected and read out to the external, out of the information of the 32 bits which belong to the selected word (address line pair) and which have been simultaneously read out to all the digit lines DL-1 to DL-32.

In the "write" operation, data supplied from an external source to the input terminal IN is written through the closed switch 8-j of the selected digit, into the only one selected bit 6-i-j corresponding to the memory cell at the selected address and digit lines. The data from the remaining 31 bits of the selected address line, which was read out to the "read" digit lines RDL, are simultaneously transmitted to the "write" digit lines WDL by data transmission circuits 9-1~9-32, and simultaneously rewritten thereinto.

Figure 2:
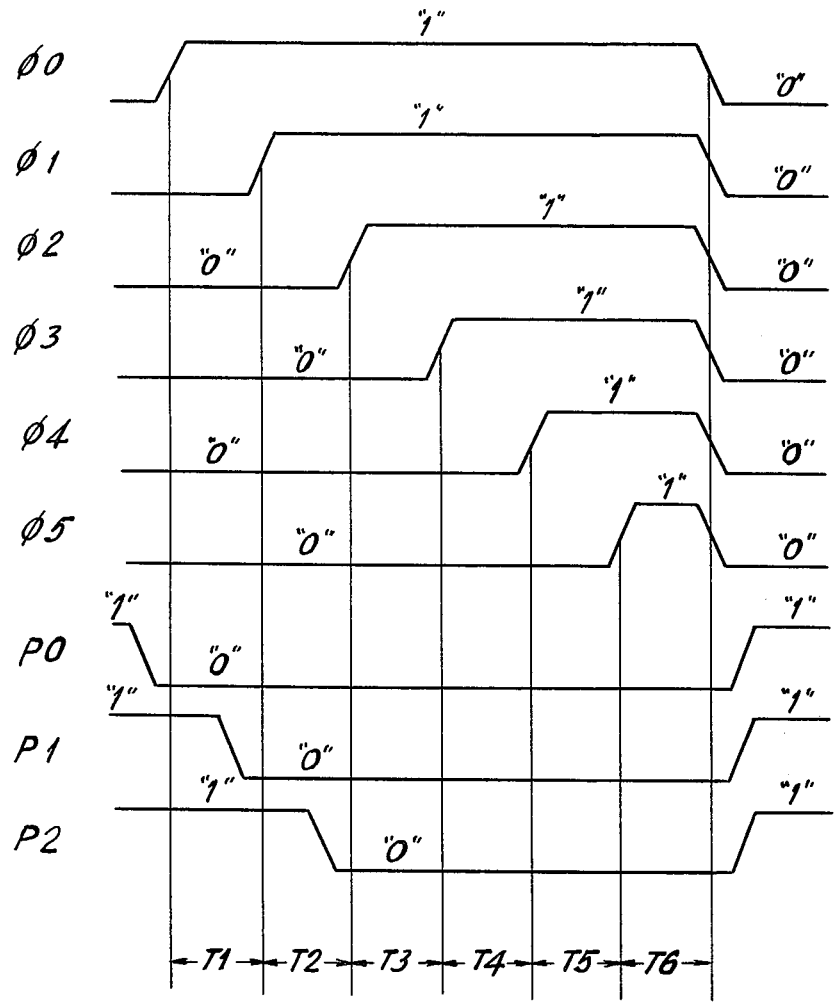
FIG. 2 illustrates the waveforms of timing signals that are employed in the operation of the memory circuit of FIG. 1.

These operations of the memory circuit of FIG. 1 are effected not concurrently but successively in time, and the sequence and mutual relation in time of the operations are determined by timing signals $\phi 0$ to $\phi 5$ and auxiliary timing signals P0 to P2 as shown in FIG. 2.

When the timing signal $\phi 0$ is supplied to the address buffers 1-0 to 1-9, the inverter transistors $Q_1$ and $Q_2$ in each buffer start to operate and true and complementary signals responsive to the input address signals $X_0$ to $X_9$ appear at output points A1 and A2 of the buffer 1. Prior to timing signal $\phi 0$, a timing signal which had clamped the levels of points A1 and A2 at the low level decreases in level. As soon as the levels of points A1 and A2 have been determined, a next timing signal $\phi 1$ is applied to the switches 2-0 to 2-9. A period T1 is a time required for determining the levels of the true and complementary signals $X_i$, $\overline{X}_i$ at the output points A1 and A2 of the address buffers 1-1 to 1-9, that is, for the operation of the address buffers.

Upon the application of timing signal $\phi 1$, the output signals $X_i$, $\overline{X}_i$ of the address buffers 1 are transmitted through the switches 2 to the inputs of the decoders 3, 3'. Before the application of timing signal $\phi 1$, a timing signal P1 having clampped the output D, D' of each decoder 3, 3' at the high level decreases. The outputs Di, D'j of the selected decoders 3-1, 3'-j in which the input signals are all in the low level are left at the high level, and the outputs of all the other decoders in which at least one input is at the high level fall to the low level. A period T2 is a time required for determining the level of the decoder outputs D, D' after the application of timing signal $\phi 1$.

Timing signal $\phi 2$ is then applied to the switches 4-1 to 4-32 and 5-1 to 5-32. The outputs Di of the selected address decoder 3-i turns the corresponding "read" address line RAL-i to the high level. Since all the "read" address lines have been clamped at the low level by the inverse timing signal $\overline{\phi 2}$, the non-selected "read" address lines remains at the low level. Prior to timing signal $\phi 2$, the timing P2, which has clamped all the "read" and "write" digit lines RDL, WDL at the high level, decreases to the low level. With the selected "read" address line RAL-i turned to the high level, "read" operation of the memory cells 6-i-1 to 6-i-32 connected to "read" address line RAL-i initiates. In detail, data stored in the capacitance at a point M (see memory cell 6-1-1) of each memory cell is read out to each "read" digit line RDL. If the point M is at the low level, "read" digit line RDL of that memory cell will remain at the high level, whereas if the point M is at the high level, "read" digit line RDL will fall to the low level by being connected to the ground through the memory cell. A period T3 is a time required from the application of timing signal $\phi 2$ to the determination of the level of the "read" digit lines RDL-1 to RDL-32.

Upon application of timing signal $\phi 3$, the data transmission circuits 9-1 to 9-32 are made active, and the level of each "write" digit line WDL is determined in accordance with the level of the corresponding "read" digit line RDL. If the "read" digit line RDL is at the low level, the "write" digit line WDL will remain at the high level to which it has been raised by timing signal P2. On the other hand, if the "read" digit line RDL is at the high level, the "write" digit line WDL is grounded and the level of WDL the "write" digit line will fall to the low level. A period T4 is a time which is necessary to determine the level of the "write" digit line WDL, or to perform the data transmission from the "read" digit lines to the "write" digit lines, after the application of timing signal $\phi 3$.

When timing signal $\phi 4$ is applied to the switches 4-1 to 4-32, the high level of the output Di of the selected address decoder 3-1 is transmitted to the corresponding "write" address line WAL-i by the switch 4-i. With the "write" address line WAL-i thus turned to the high level, the data having been transmitted to the "write" digit lines WDL-1 to WDL-32 are sent to the point M of the respective memory cells 6-i-1 to 6-i-32 connected with this address line. This is the "rewrite" (or "refresh") operation of the stored data, because the data having been transmitted to the "write" digit lines WDL are in conformity with the stored data of the memory cells. A period T5 is a time for the "rewrite" operation.

For writing new data into a memory cell from the external, a timing signal $\phi 5$ is applied to the "write" digit lines WDL-1 to WDL-32. Then the timing signal $\phi 5$ becomes high in level, all the "write" digit lines are prepared to be connected to the data input terminal IN, and only the selected "write" digit line WDL-j in which the switch 8-j has been already closed by the high level D'j of the selected digit decoder 3'-j is now allowed to receive a new information from the external data source which is written into the memory cell 6-i-j connected to both the selected address and digit lines. A period T6 is a time required for a new information to be transmitted from the external source through "write" digit line to the point M of the memory cell. The "read" operation of the stored data from the selected "write" digit line to the output terminal OUT is also preformed in this period T6 by using timing signal $\phi 5$.

The periods T1 to T6 are those necessary for the partial operations of the memory circuit. If the intervals between the starting times of the timing signals are shorter than those periods, an incorrect operation will occur. If the intervals are set to be long, a correct operation will be made, but the speed will become low.

Figure 3:
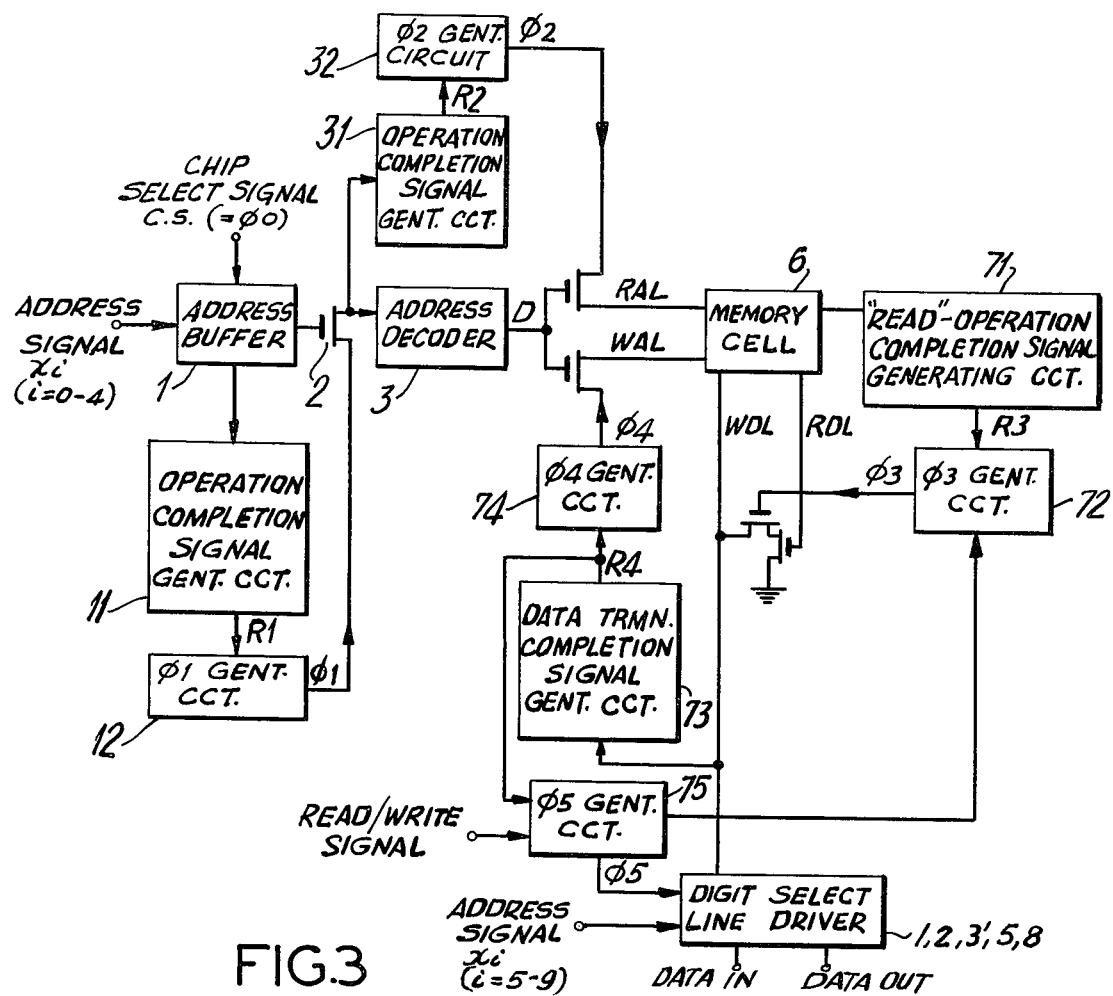
FIG. 3 is a block diagram of an embodiment of the invention.

As a method of efficiently generating the timing signals having the necessary accurate mutual relations in time, the present invention provides a system. The principle of that system is shown illustrated by the circuit schematically illustrated in FIG. 3. Referring to FIG. 3, the memory device of the invention comprises an operation completion signal generating circuit 11 receiving the outputs of the address buffer 1 and generating a signal R1 which indicates the completion of the operation of the address buffer 1. The system further includes a timing signal (here $\phi 1$) generating circuit 12 which receives the address buffer operation completion signal R1 and generates the timing signal $\phi 1$. A second operation completion signal generating circuit 31 is provided in parallel with the address decoder 3. Circuit 31 generates a decoder operation completion signal R2 which in turn is applied to a $\phi 2$ generating circuit 32. A "read"-operation completion signal generating circuit 71 is connected in parallel with the memory cells 6 for generating a signal R3 in response to the completion of the "read" operation of the stored data from the memory cells 6 to the "read" digit lines RDL. A $\phi 3$ generating circuit 72 is connected to the output of circuit 71 and produces the timing signal $\phi 3$ by the use of the "read" operation completion signal R3. A data transmission completion signal generating circuit 73 is connected to a "write" digit line WDL for generating a signal R4 which represents the completion of the data transmission from the "read" digit lines to the "write" digit lines. By using the data transmission completion signal R4, the timing signal $\phi 4$ is generated in a $\phi 4$ generating circuit 74 and the timing signal $\phi 5$ is generated in a $\phi 5$ generating circuit 75, both of which receive the transmission completion signal R4 from circuit 73.

The circuit of FIG. 3 may be considered as necessitating extra circuits and introducing a superfluous time delay. However, the speed does not become slow and the margin required for the timing pulses to be applied from the external timing signal generator can be omitted, by the use of the circuits automatically generating the timing signals as described.

Examples of the operation completion signal generating circuits 11 and 31 that can be employed in the memory circuit of the invention are disclosed in detail, with reference to FIGS. 4 to 9.

Figure 4:
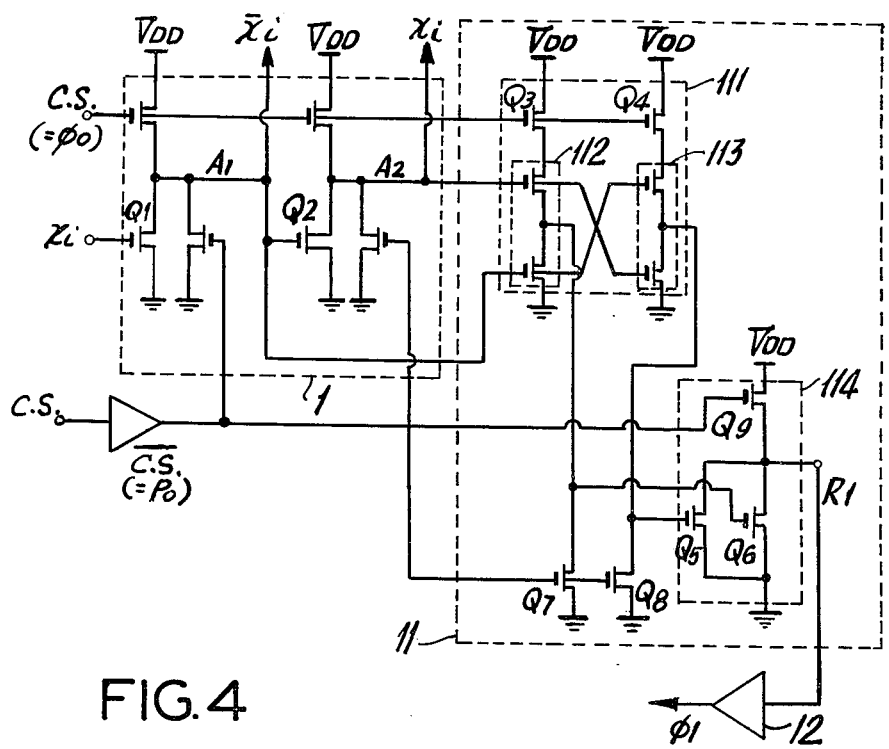
FIG. 4 is a diagram of an example of a circuit generating an address buffer operation completion signal according to the invention.

Referring to FIG. 4, the operation completion signal generating circuit 11 that produces the address buffer operation completion signal R1 comprises a complementary switching circuit 111 including two cross connected "totem pole" or push-pull drivers 112 and 113. These drivers are connected between ground potential and a source of drain voltage $V_{DD}$ through IGFET's $Q_3$ and $Q_4$ which are made conductive when timing signal $\phi 0$ is applied to their gates. Each push-pull driver 112 and 133 includes two IGFET's connected in series. The inputs of the push-pull drivers are connected to the outputs A1 and A2 of the address buffer 1, and the outputs of the push-pull drivers 112 and 113 are connected to the inputs of a NOR circuit 114. The NOR circuit 114 comprises two IGFET's $Q_5$ and $Q_6$ connected in parallel between ground and $V_{DD}$ through the source-drain path of an IGFET $Q_9$. The inputs of NOR circuit 114 are respectively connected to ground through the source-drain paths of IGFET's $Q_7$ and $Q_8$ which become conductive when the timing signal PO is applied to their gates. Upon the application of timing signal PO, therefore, the output of NOR circuit 114, which is the output of the RL signal generating circuit, is always at the high level.

The address buffer 1 receives one address signal $X_i$, a memory chip select (C.S.) signal as the timing signal $\phi 0$, and the inverted C.S. signal as the timing signal PO. When the C.S. signal is at the low level, the output points A1 and A2, which are the outputs of the first stage inverter transistor $Q_1$ and the second stage inverter transistor, are both at the low level. When the C.S. signal is turned to the high level, the output points A1 and A2 are both about to increase to half the high level. Before long, however, only one of the output points goes to the high level, and the other returns to the low level. The push-pull drivers 112 and 113 are made active when the C.S. signal is at the high level, and the outputs of either of the drivers 112 and 113 becomes at the high level only when the level difference between the two inputs, that is, the difference between the levels of the output points A1 and A2 of the address buffer 1 becomes large. The outputs of the NOR circuit 114 receiving the outputs of the drivers 112 and 113 falls to the low level when the levels of the driver outputs are thus determined. This change of the output of the NOR circuit 114 indicates that the operation of the address buffer 1 is fully completed. Therefore, the output signal R1 of the circuit 11 is used as an address buffer operation completion signal. This signal R1 is applied to the $\phi 1$ generating circuit 12, which is an inverting circuit. The inverter R1 signal is used as the timing signal $\phi 1$.

Figure 5:
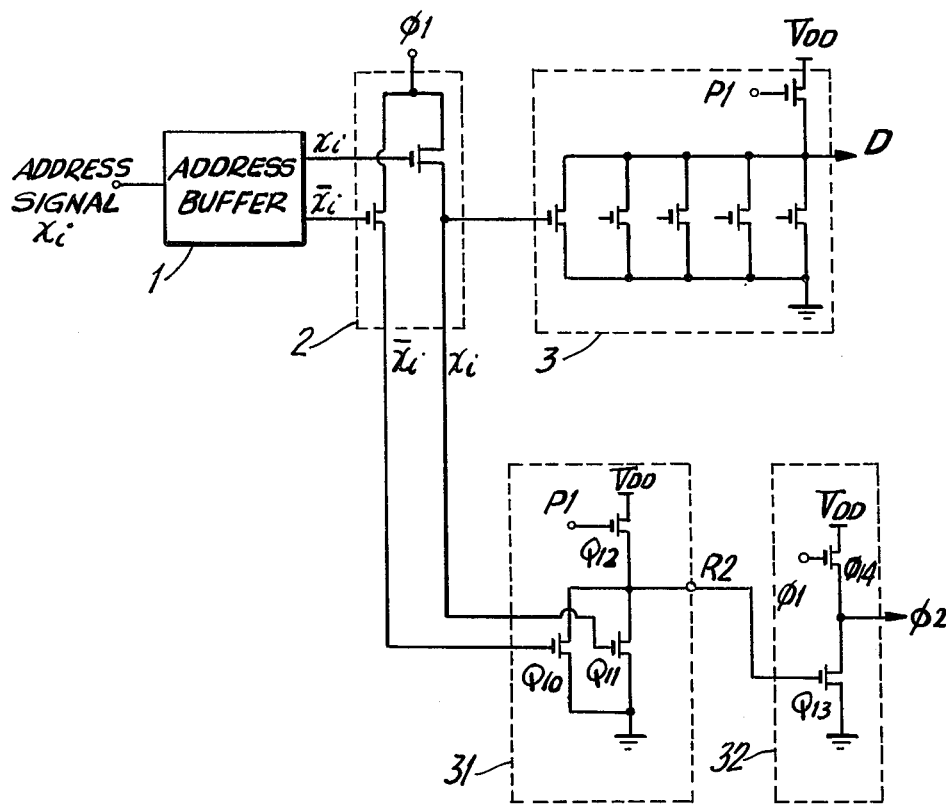
FIG. 5 is a diagram of an example of a circuit generating a decoder operation completion signal according to the invention.

FIG. 5 shows, in greater detail, the circuit 31 generating the completion signal R2 of the decoder operation and the $\phi 2$ generating circuit 32. Circuit 31 is a two-input NOR or OR circuit comprising two IGFET's $Q_{10}$ and $Q_{11}$ connected in parallel. One of the commonly connected points of these IGFET's is connected to ground and the other is connected to $V_{DD}$ through another IGFET $Q_{12}$ which is controlled by the timing signal P1. Circuit 31 is the same in structure as the decoder circuit 3 except that it has only two inputs. The true and complementary signals of one address signal $X_i$ are applied to the two inputs of circuit 31 at the gates of IFGET's $Q_{10}$ and $Q_{11}$.

Figure 6:
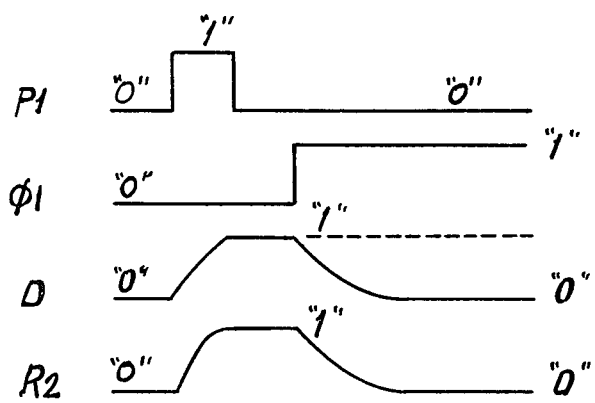
FIG. 6 illustrates waveforms of signals involved in the operation of the circuit of FIG. 5.

All decoder circuits 3, 3' are raised to the high level in advance by the timing signal P1, and the inputs of the decoders are thereafter supplied by the timing signal $\phi 1$, as shown in FIG. 6 Although the outputs D of non-selected decoders are turned to the low level, it is not determinate which decoders are not selected by the address signals. However, since the quasi-decoder generating circuit 31 receives as its inputs both the true and complementary signals of address signal $X_i$, circuit 31 always changes its output level from the high to the low level in response to the reception of the address signal, irrespective of the "1" or "0" level of the address signal. Consequently, the output signal R2 of circuit 31 represents the completion of the decoder operation.

In order to make the operating time of the R2 generating circuit 31 substantially the same as that of the decoder circuits 3, the sizes of the IGFET's constituting the R2 generating circuit and the decoder circuits 3 should be made equal and the value of the capacitance at the output point of the circuit 31 should be adjusted so as to be equal to the capacitance value at the output point of the decoder circuits 3. In order that, in consideration of safety of the circuit operation, the level of signal R2 decreases after all the decoder circuits have surely completed their operation, the value of the capacitance at the output of the circuit 31 should be made slightly larger than that of the decoder circuit 3.

The $\phi 2$ generating circuit 32 comprises a gate IGFET $Q_{13}$ and a load IGFET $Q_{14}$ connected in series between $V_{DD}$ and ground. The load transistor $Q_{14}$ is controlled by timing signal $\phi 1$. The input of the circuit 32 receives the $R_2$ signal and the output signal of circuit 32, which is the timing signal $\phi 2$, is an inverted signal of the $R_2$ signal.

Figure 7:
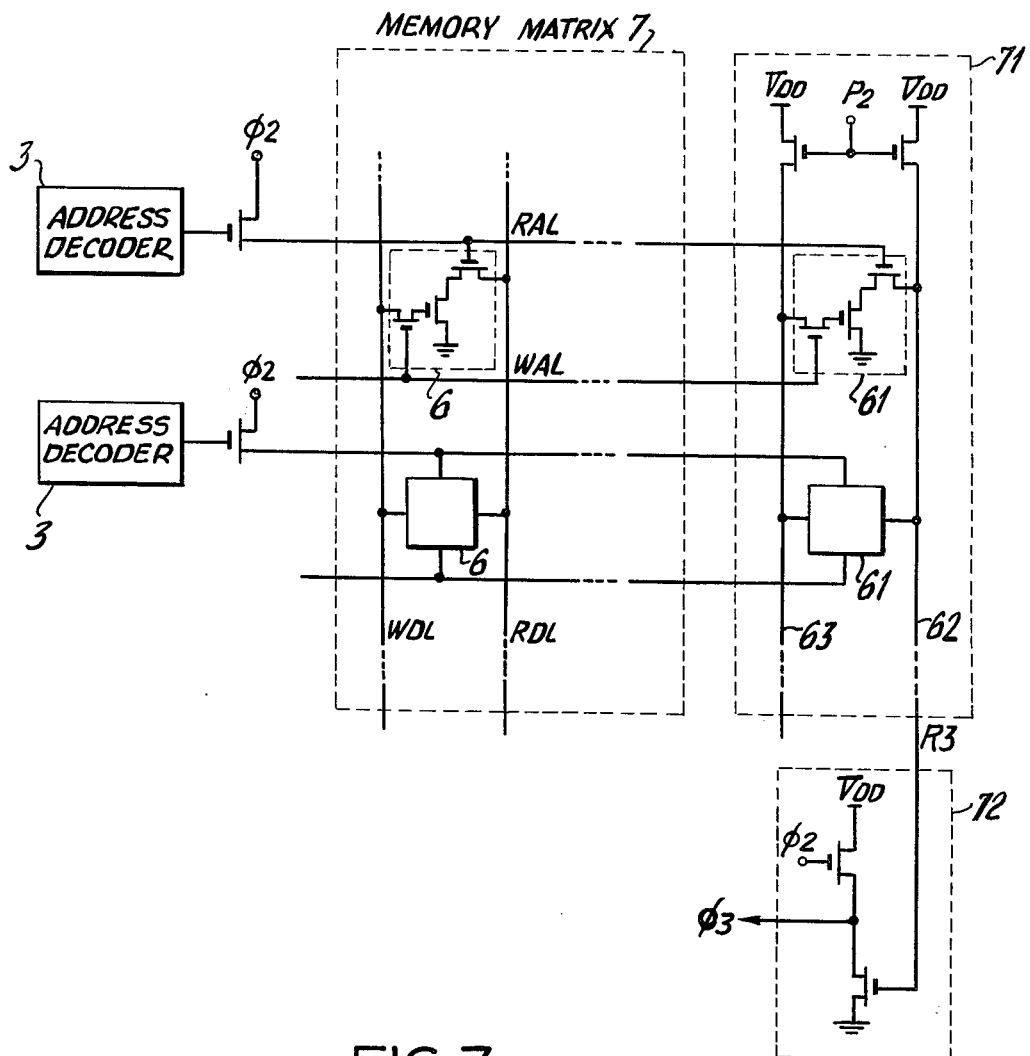
FIG. 7 is a diagram of an example of a circuit generating a "read" operation completion signal according to the invention.

FIG. 7 shows a circuit 71 that generates a signal R3 indicating the completion of the operation that the selected "read" address line is turned to the high level and thereby the stored data are read out from the memory cells to the "read" digit lines. Circuit 71 comprises a plurality of memory cells 61 which are the same in structure as the memory cells 6 of the memory matrix 7. Each memory cell 61 is connected to each "read" address line and is adapted to change the level of a "read" digit line 62 connected thereto from the high level to the low level, whenever the "read" address line is at the high level. Since the memory cell 61 of the R3 generating circuit 71 is connected to each of the "read" address lines, the digit line 62 of circuit 71 changes from the high level to the low level without fail irrespective of which address line is selected. Accordingly, the change in level of "read" digit line 62 can be considered to indicate the completion of the "read" operation of the stored data to the "read" digit lines RDL. Therefore, the signal R3 appearing on "read" digit line 62 is used as the "read" operation completion signal. As the $\phi 3$ generating circuit 72, an inverter circuit may be simply used. The timing signal $\phi 3$ is thus an inverted signal of the R3 signal.

Figures 8A, 8B:
FIGS. 8A and 8B are diagrams of other examples of memory cells to be used in the circuit of FIG. 7.

The memory cells 61' and 61'' illustrated in FIGS. 8(A) and 8(B) may be used as a memory cell of the R3 generating circuit 71 instead of the circuit 61 of FIG. 7. In the memory cell 61' of FIG. 8(A), the control gate of the "write" gate transistor $Q_{15}$ is connected not to a "write" address line but to the "read" address line RAL, so that even where no "write" operation has been made after the connection of an external power supply to the memory circuit, the high level is always written into and then read out of the point M when the "read" address line RAL is connected to memory cell 61' is turned to the high level for the "read" operation. The memory cell 61'' of FIG. 8(B) is simple, containing only a single IGFET, and is conveniently used especially where the memory is a read-only memory.

Figures 9, 12:
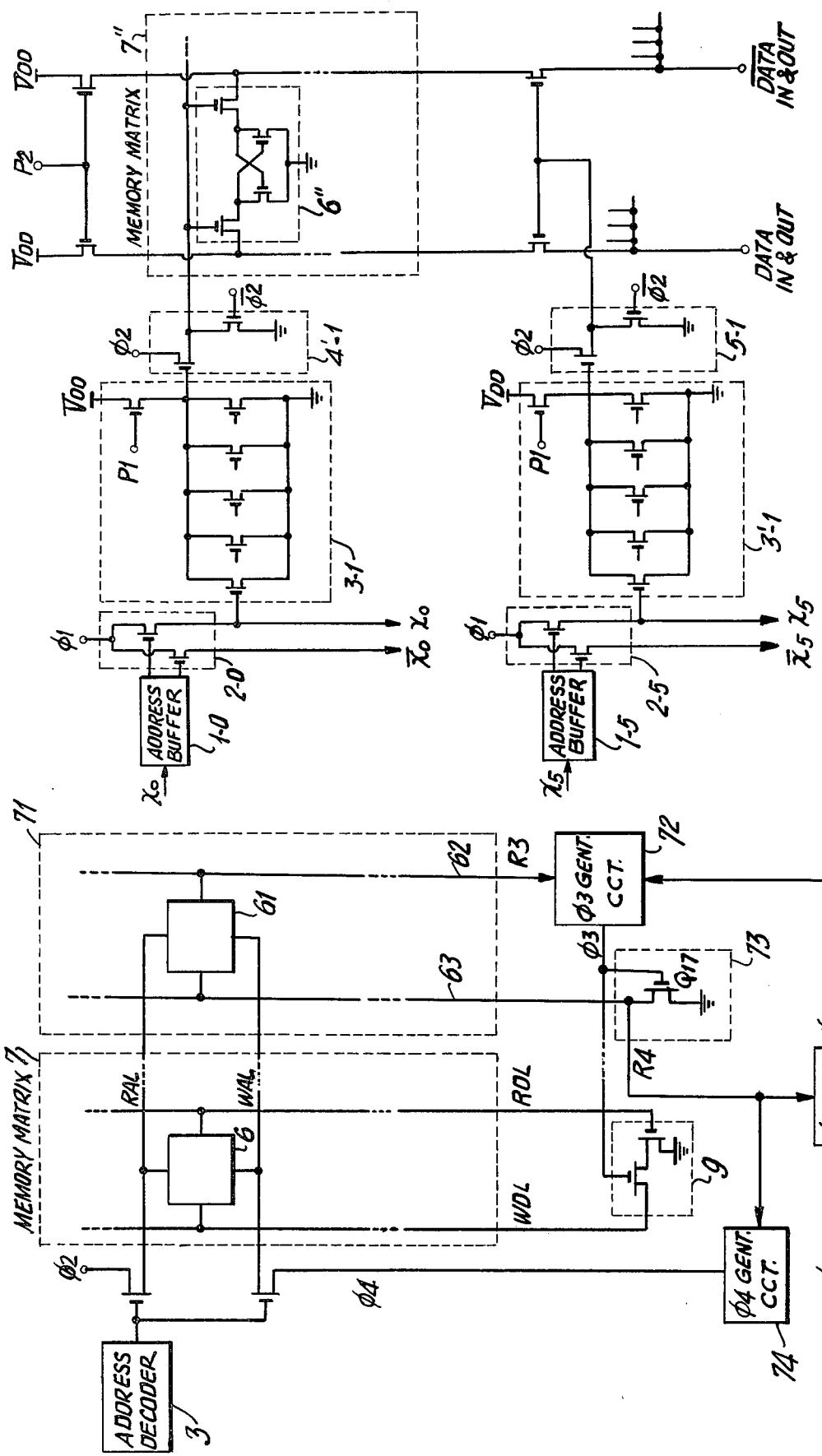
FIG. 9 is a diagram of an example of a circuit generating a data transmission completion signal according to the invention.
FIG. 12 is a diagram of another embodiment of the invention which is applied to a memory circuit employing 4-transistor dynamic memory cells.

Circuit 73 that generates the completion signal R4 of the data transmission from the "read" digit lines RDL to the "write" digit lines comprises, as shown in FIG. 9, a "write" digit line 63 connected to the memory cells 61 of the R3 generating circuit 71, and an IGFET $Q_{17}$ connected between one end of the digit line 63 and ground. The timing signal $\phi 3$ is applied to the gate of the IGFET $Q_{17}$ as an input of circuit 73. The output $R_4$ signal of circuit 73 is derived from the one end of the digit line 63.

The usual "write" digit lines WDL of the memory matrix 7 remain at the high level or fall to the low level in dependence on the stored data of the memory cells 6. In contrast, the digit line 63 is always turned to the low level when the timing signal $\phi 3$ is supplied to circuit 73. Therefore, the completion of the data transmission can be known from the fall of the level of the digit line 63, that is, of the output signal R4 of the circuit 73.

In order to ensure this operation, the capacitance of the digit line 63 should be made equal to or larger than that of the "write" digit line WDL of the memory matrix 7.

The $\phi 4$ generating circuit 74 which receives the R4 signal, may conveniently be an inverter circuit for inverting the R4 signal.

In the embodiment of the memory circuit of the invention herein specifically illustrated, the "write" operation means that a new information is written into only one bit of the selected address line from the external data source and the stored information is rewritten into the remaining bits of the selected address line. The fact that the transmission of the stored information to the "write" digit line WDL has been completed signifies that the timing signal $\phi3$ may now be stopped and a new information may be fed from the external source to the selected "write" digit line. Therefore, the R4 signal is applied not only to the $\phi4$ generating circuit 74 but also to the $\phi5$ generating circuit 75. In the $\phi5$ generating circuit 75, which may be a two input AND or NAND circuit, the timing signal $\phi5$ is generated only when the R4 signal as one input and a write control signal as the other input are both supplied to the circuit 75 at the same time. The generated timing signal $\phi5$ is applied to the $\phi3$ generating circuit 72 where the generation of timing signal $\phi3$ is stopped by the use of the timing signal $\phi5$ (shown in FIGS. 3 and 9 but omitted for simplicity of illustration in FIG. 7), and is employed to introduce new information from the terminal IN into the selected digit line. Instead of stopping the timing signal $\phi3$ by the timing signal $\phi5$, all the "read" digit lines may be brought into the low level by using timing signal $\phi5$ to achieve the same effect.

The description has been made of the memory circuits of such kind that the memory cell 6 is composed of three IGFET's and the "read" digit lines are separated from the "write" digit line. The feature of the invention, however, resides in the generation of control timing signals of the memory circuits, and the invention is applicable irrespective of differences in memory cells or memory matrix.

Figure 10:
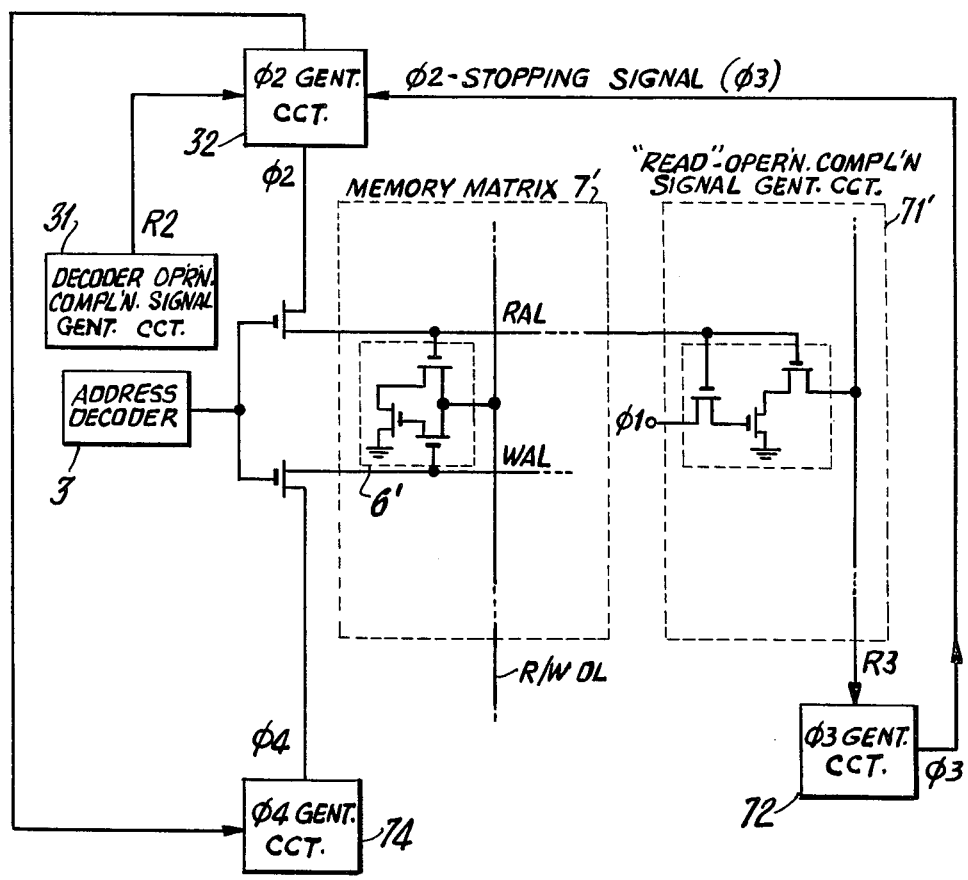
FIG. 10 is a block diagram of another embodiment of the invention which is applied to a memory circuit employing 3-transistor memory cells with a single digit line for each memory cell.
Figure 11:
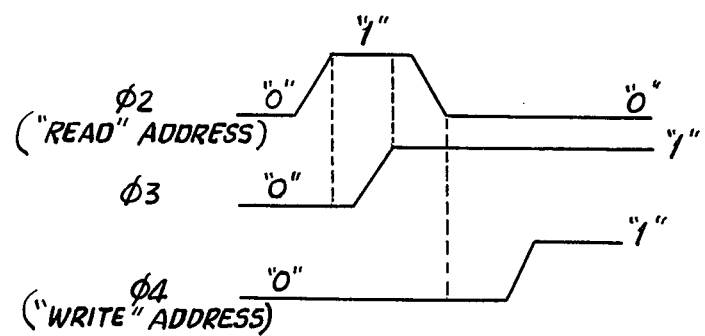
FIG. 11 illustrates waveforms of signals involved in the operation of the circuit of FIG. 10.

For example, FIG. 10 shows a memory circuit having three IGFET's in each memory cell 6' and in which the "read" digit lines are combined with the "write" digit lines as "read/write" digit lines R/WDL. With this circuit, timing signal $\phi2$ is turned to the low level by the timing signal $\phi3$ to lower the level of the selected "read" address line and thereafter, timing signal $\phi4$ is raised to turn the selected "write" address line WAL to the high level, as shown in FIG. 11.

In one system, after the "read" address line has fallen, the digit line is precharged again and then the "write" address line is raised to the high level. In another system, the "write" address line is raised to the high level without the second precharging. These systems are substantially the same except that the former system needs a further timing signal which should be introduced after the fall of timing signal $\phi2$ and before the rise of timing signal $\phi4$.

FIG. 12 shows a memory circuit which employs four IGFET's in each memory cell 6''. This memory circuit has a single address line, and hence requires a smaller number of timing signals. A method of generating the timing signal is the same as that mentioned in the foregoing. More specifically, the address and digit decoders 3, 3' are driven by timing signal $\phi1$, while timing signal $\phi2$ is produced by the decoder operation completion signal generating circuit as shown by circuit 31 of FIG. 5.

In a read-only memory circuit, a single common address line is employed, and the same timing signals as in the circuit of FIG. 12 are sufficient.

Figure 13:
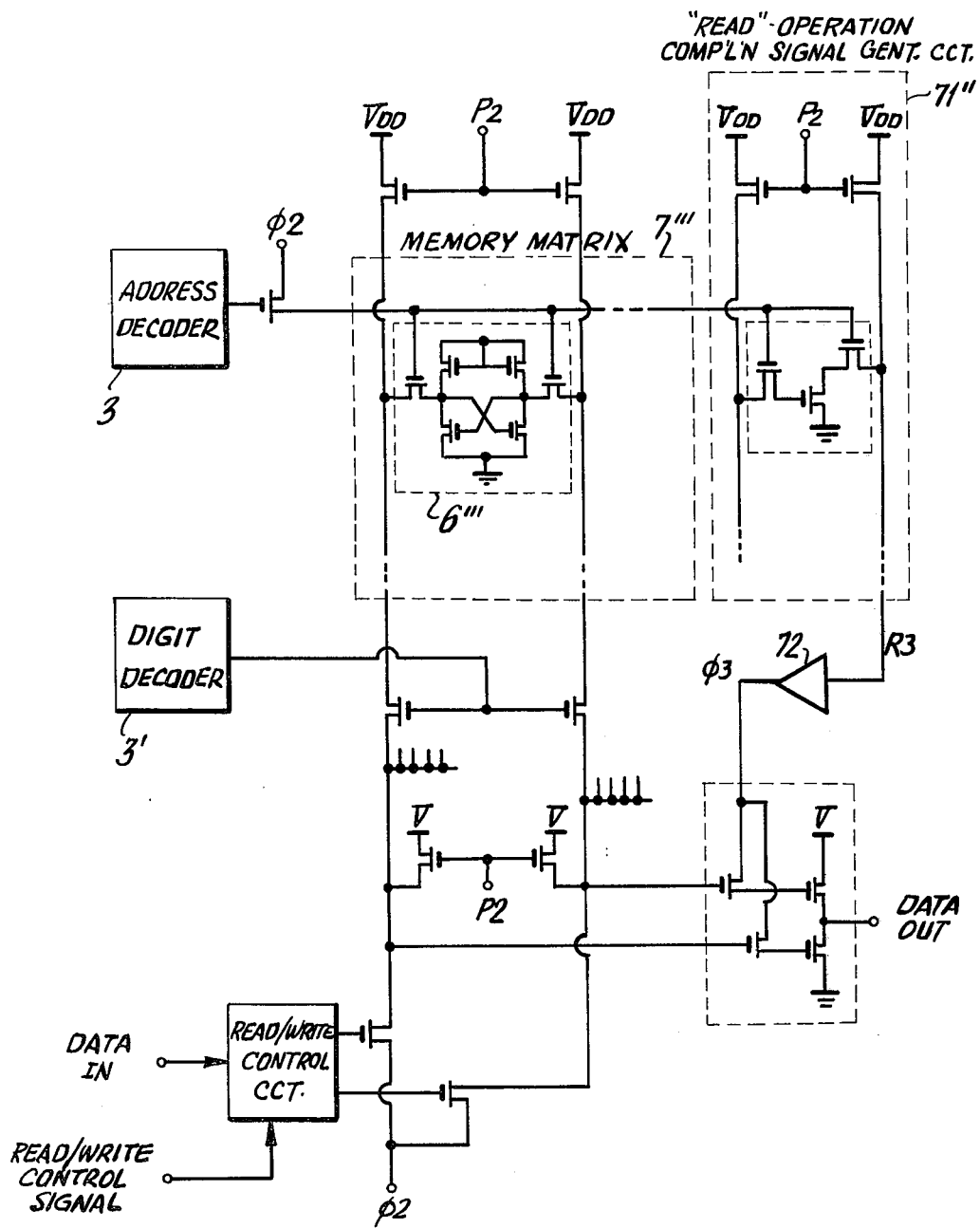
FIG. 13 is a diagram of a further embodiment of the invention applied to a memory circuit employing 6-transistor static memory cells.

FIG. 13 represents an example of the static memory circuits in which each memory cell 6''' is composed of six IGFET's. Although the memory cell is of the static type, the peripheral circuits are of the dynamic type. As a whole, the manner of control of the memory circuit is not very different from that of the memory circuits mentioned in the foregoing.

Figure 14:
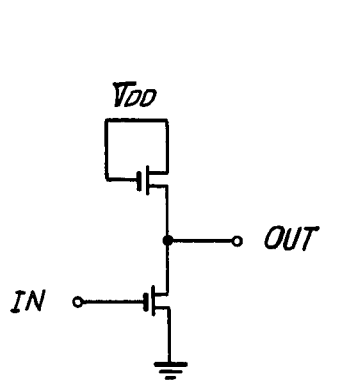
FIG. 14 is a diagram of a 1-stage inverter circuit.
Figure 15:
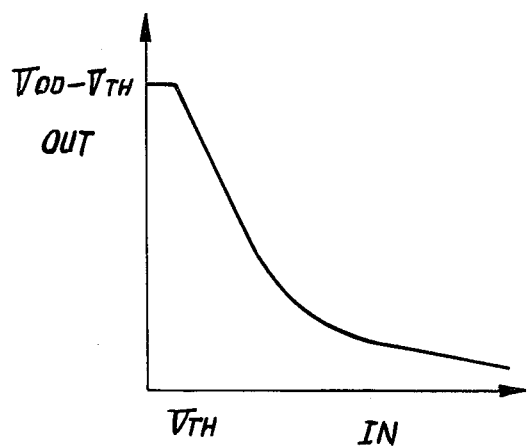
FIG. 15 is a graph showing the transmission characteristic of the inverter circuit of FIG. 14.
Figure 16:
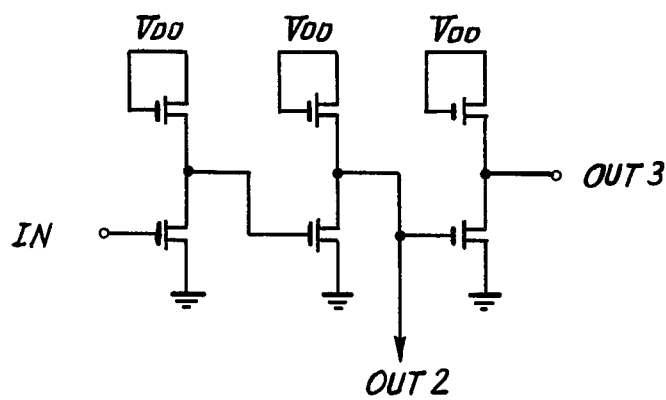
FIG. 16 is a diagram of a 3-stage inverter circuit employing IGFET's.
Figure 17:
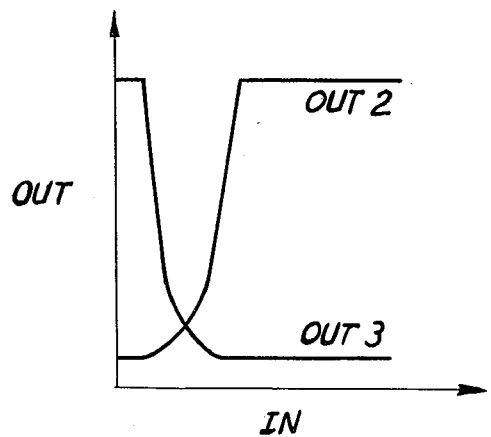
FIG. 17 is a graph showing the transmission characteristic of the circuit of FIG. 16.

In the previous description, the term "inverter circuit" has been used. The inverter circuit composed of two IGFET's as shown in FIG. 14 has an unclear threshold voltage $V_{TH}$ as will be seen from FIG. 15, and its gain is small. In contrast, a multistage inverter circuit in which two or more inverter circuits are connected in cascade as shown in FIG. 16 has a sharper transmission characteristic as shown in FIG. 17. Therefore, the term "inverter circuit" as used in this specification is intended to include a multistage inverter circuit. Thus, whereas the memory circuit of the invention has been described with respect to several embodiments, it will be appreciated that modifications may be made therein all without departing from the spirit and scope of the invention.

We claim:

1. A memory circuit employing insulated-gate field-effect transistors, said memory circuit comprising a plurality of terminals for receiving a plurality of address signals, a terminal for receiving a single timing signal, a plurality of circuits to be operated in sequence, and means for controlling the commencement of operation of each of said plurality of circuits, said controlling means including a control circuit having an operation time substantially similar to that of one of said plurality of circuits, said control circuit receiving the same input signal as that for said one circuit and producing an output signal that is applied to and effective to initiate the operation of the succeeding one of said plurality of circuits subsequent to said one circuit upon the completion of operation of said one circuit, whereby said plurality of circuits of said memory circuit are operated automatically in a predetermined sequence with said single timing signal.

2. A memory circuit employing insulated-gate field-effect transistors, said memory circuit comprising a plurality of address buffers receiving address signals, a plurality of decoders, a matrix of memory cells arranged in rows and columns, each of said memory cells being capable of temporarily storing information, a plurality of address lines and digit lines connected to said memory cells in a matrix pattern, said address lines including "read" address lines adapted to command memory cells to read information and "write" address lines adapted to command memory cells to write information, said digit lines including "read" digit lines adapted to receive information read out of said memory cells and "write" digit lines adapted tor receive information to be written into said memory cells, first means for connecting the outputs of said address buffers to the inputs of said decoders in response to a first signal, second means for connecting the outputs of said decoders to said "read" address lines in response to a second signal, third means for transmitting information of said "read" digit lines to said "write" digit lines in response to a third signal, fourth means for connecting the outputs of said decoders to said "write" address lines in response to a fourth signal, a first circuit detecting the completion of the operation of said address buffers and generating said first signal, a second circuit detecting the completion of the operation of said decoders and generating said second signal, a third circuit detecting the completion of the operation of reading information out of said memory cells and generating said third signal, and a fourth circuit detecting the completion of the transmission of information to said "write" digit lines and generating said fourth signal.

3. The memory circuit of claim 2, in which said second circuit includes a control circuit having an operation time substantially equivalent to that of said plurality of decoders.

4. A memory circuit comprising a plurality of address buffer circuits, a plurality of decoders, a matrix of memory cells arranged in a plurality of rows and columns, a plurality of row conductors and column conductors connected to said memory cells in a matrix pattern, a first circuit detecting the completion of operation of said address buffer circuits and generating a first signal, first means for connecting the outputs of said address buffer circuits to the inputs of said decoders in a predetermined combination in response to said first signal, a second circuit starting operation in response to said first signal and generating a second signal after the completion of operation of said decoders, and second means for connecting the outputs of said decoders to at least one of said row conductors and said column conductors in response to said second signal.

5. A memory circuit comprising a plurality of address buffer circuits for receiving address signals and for generating the true and complementary signals of said address signals, a plurality of decoders, a circuit receiving the true and complementary signals of one of said address signals, said circuit including means for detecting the difference in the electric potential levels of the received signals and for generating a control signal when the difference detected exceeds a predetermined value, and means for connecting the outputs of said address buffer circuits to the inputs of said decoders in predetermined combinations in response to said control signal.

6. A memory circuit comprising a plurality of decoders, a matrix of memory cells arranged in a plurality of rows and columns, a plurality of row conductors and column conductors connected to said memory cells in a matrix pattern, a control circuit starting its operation at the same time as the commencement of operation of said decoders and generating a control signal after the completion of operation of said decoders, and means for connecting the output circuits of said decoders to said row conductors in response to said control signal.

7. The memory circuit of claim 6, in which said decoders receive the true and complementary signals of input address signals, each of said decoders including one of an OR circuit and a NOR circuit, said control circuit including one of an OR circuit and a NOR circuit receiving both the true and complementary signals of one of said input address signals.

8. A memory circuit employing insulated-gate field-effect transistors, said memory circuit comprising a matrix of memory cells arranged in a plurality of rows and columns, each of said memory cells being capable of temporarily storing information, a plurality of address lines and digit lines respectively operatively connected to said memory cells in a matrix pattern, said address lines including "read" address lines and "write" address lines adapted respectively to command said memory cells to read and write information, said digit lines including "read" digit lines and "write" digit lines adapted respectively to receive information read out of and to be written into said memory cells, a control circuit detecting the completion of the operation of reading information out of said memory cells and generating a control signal, and means for transmitting information of said "read" digit lines to said "write" digit lines in response to said control signal.

9. The memory circuit of claim 8, in which said control circuit includes additional memory cells and an additional "read" digit line, each of said additional memory cells being connected to each of said "read" address lines, said additional "read" digit line being connected to all of said additional memory cells.

10. The memory circuit of claim 9, in which said additional memory cells are capable of temporarily storing information.

11. The memory circuit of claim 9, in which said additional memory cells have the same structure as that of said memory cells of said memory matrix, each of said additional memory cells being connected to each of said "write" address lines.

12. The memory circuit of claim 8, in which said control circuit includes a plurality of insulated-gate field-effect transistors and an additional "read" digit line, the gates of said transistors being respectively connected to said "read" address lines, one of the sources and drains of said transistors being connected to said additional "read" digit line and the other of the sources and drains of said transistors being connected in common.

13. The memory circuit of claim 8, further comprising another control circuit detecting the completion of the transmission of information from said "read" digit lines to said "write" digit lines and generating another control signal, and means for applying a signal to a selected one of said "write" address lines in response to said another control signal.

14. The memory circuit of claim 13, in which said another control circuit includes an input terminal adapted to receive said control signal, another digit line, and means for changing the level of said another digit line whenever said control signal is applied to said input terminal.

15. The memory circuit of claim 13, in which said control circuit comprises additional memory cells connected respectively to said "read" address lines and an additional "read" digit line connected to all of said additional memory cells, said another control circuit including an input terminal adapted to receive said control signal, an additional "write" digit line operatively connected to all of said additional memory cells, and means for changing the level of said additional "write" digit line whenever said control signal is applied to said input terminal.

16. A memory circuit employing insulated-gate field-effect transistors, said memory circuit comprising a matrix of memory cells arranged in a plurality of rows and columns, each of said memory cells being capable of temporarily storing information, a plurality of address lines and digit lines operatively connected to said memory cells in a matrix, said address lines including "read" address lines adapted to command said memory cells to read information stored therein, means for applying a drive signal to a selected one of said "read" address lines, a control circuit detecting the completion of the operation of reading information out of said memory cells and generating a control signal, and means for terminating said drive signal in response to said control signal.

17. The memory circuit of claim 16, in which said control circuit comprises additional memory cells operatively connected respectively to said "read" address lines and an additional digit line operatively connected to all of said additional memory cells.

* * * * *